United States Patent
Chen et al.

(10) Patent No.: US 7,881,147 B2
(45) Date of Patent: *Feb. 1, 2011

(54) CLOCK AND CONTROL SIGNAL GENERATION FOR HIGH PERFORMANCE MEMORY DEVICES

(75) Inventors: Zhiqin Chen, San Diego, CA (US); Chang Ho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 11/756,017

(22) Filed: May 31, 2007

(65) Prior Publication Data

US 2008/0298142 A1 Dec. 4, 2008

(51) Int. Cl.
G11C 8/00 (2006.01)
(52) U.S. Cl. .................. 365/233.1; 365/194; 365/210.1
(58) Field of Classification Search ............. 365/233.1, 365/194, 210.1, 365
See application file for complete search history.

(56) References Cited

U.S. PATENT DOCUMENTS

| | | | |
|---|---|---|---|
| 7,142,466 B1 | 11/2006 | Muthalif et al. | |
| 7,215,104 B2* | 5/2007 | Nakata et al. | 323/282 |
| 7,268,526 B1* | 9/2007 | Smith | 323/285 |
| 7,372,745 B2* | 5/2008 | Kitamura | 365/189.05 |
| 7,626,880 B2* | 12/2009 | Tsern et al. | 365/220 |
| 2004/0190323 A1 | 9/2004 | Ashizawa et al. | |
| 2005/0169078 A1 | 8/2005 | Balasubramanian et al. | |
| 2007/0109884 A1* | 5/2007 | Jung | 365/200 |
| 2008/0298143 A1* | 12/2008 | Chen et al. | 365/194 |

FOREIGN PATENT DOCUMENTS

EP 1630815 A1 3/2006

OTHER PUBLICATIONS

International Search Report and Written Opinion-PCT/US08/065448, International Search Authority-European Patent Office-Nov. 12, 2008.

* cited by examiner

*Primary Examiner*—Hoai V Ho
*Assistant Examiner*—Fernando N Hidalgo
(74) *Attorney, Agent, or Firm*—Sam Talpalatsky; Nicholas J. Pauley; Peter M. Kamarchik (57) ABSTRACT

Techniques for generating clock and control signals to achieve good performance for read and write operations in memory devices are described. In one design, a clock and control signal generator within a memory device includes first and second clock generators, first and second control signal generators, and a reset circuit. The first clock generator generates a first clock signal used for read and write operations. The second clock generator generates a second clock signal used for write operations. The reset circuit generates at least one reset signal for the first and second clock generators. The reset signal(s) may have timing determined based on loading due to dummy cells. The first control signal generator generates control signals used for read and write operations based on the first clock signal. The second control signal generator generates control signals used for write operations based on the second clock signal.

30 Claims, 9 Drawing Sheets

CLOCK AND CONTROL SIGNAL GENERATION FOR HIGH PERFORMANCE MEMORY DEVICES

BACKGROUND

I. Field

The present disclosure relates generally to electronics, and more specifically to techniques for generating clock and control signals in memory devices.

II. Background

Memory devices are commonly used in many electronics devices such as computers, wireless communication devices, personal digital assistants (PDAs), etc. A memory device typically includes many rows and columns of memory cells. Each memory cell can store a data value, which is typically either binary '0' or '1'. To read a memory cell in a given row and a given column, a word line for the row is activated, and the memory cell either charges or discharges a bit line for the column depending on the data value stored in the memory cell. A sense amplifier then detects the voltage on the bit line and provides a logic value based on the detected voltage. To write to a memory cell in a given row and a given column, the word line for the row is activated. A data input driver then drives the bit line for the column either low or high depending on a data value to be written to the memory cell. The data value currently stored in the memory cell is overwritten by the value on the bit line.

For a read operation, the sense amplifier should be turned on as early as possible and for a minimum amount of time in order to achieve high operating speed and low power consumption. The sense amplifier may be activated after the bit line has been sufficiently charged or discharged, so that the data value stored in the memory cell can be reliably detected. This charge/discharge time is dependent on characteristics of transistors in the memory cells and parasitic effects, both of which may vary widely due to variations in integrated circuit (IC) process, power supply voltage, and temperature. For a write operation, the data input driver should be turned on for as long as needed to write a data value into the memory cell. The amount of time needed to write to the memory cell is dependent on the transistor characteristics and parasitic effects.

There is therefore a need in the art for techniques to generate clock and control signals for read and write operations such that high operating speed can be achieved in the presence of IC process, voltage, and temperature (PVT) variations.

SUMMARY

Techniques for generating clock and control signals to achieve good performance for read and write operations in memory devices are described herein. In one design, a memory device includes a memory array, a clock and control signal generator, and other circuit blocks. The memory array includes memory cells for storing data and dummy cells to mimic certain characteristics (e.g., loading) of the memory cells. The clock and control signal generator generates clock and control signals used for writing data to the memory cells and reading data from the memory cells.

In one design, the clock and control signal generator includes first and second clock generators, first and second control signal generators, and a reset circuit. The first clock generator generates a first clock signal used for read and write operations. The second clock generator generates a second clock signal used for write operations and may be disabled for read operations. The first and second clock signals may be generated with equal delays to achieve high-speed read and write for the memory device. The reset circuit generates at least one reset signal for the first and second clock generators. The reset signal(s) may have timing determined based on loading on a bit line for a column of dummy cells and/or a word line for a row of dummy cells. The reset signal(s) may also have different delays for read and write operations to achieve good timing margins for both read and write operations.

The first control signal generator generates a word line control clock (RCLK) signal and an address latch enable (ALE) signal used for read and write operations and a sense amplifier enable (SEN) signal used for read operations based on the first clock signal. The second control signal generator generates a data input driver clock (WCLK) signal and a data latch enable (DLE) signal used for write operations based on the second clock signal. The RCLK and WCLK signals may be generated with equal delays based on the first and second clock signals, respectively. The ALE and DLE signals may be generated with equal delays and possibly equal pulse widths, e.g., without using one-shot circuits. The ALE signal may be generated based on the first clock signal and a reset signal for the first clock generator. The DLE signal may be generated based on the second clock signal and a reset signal for the second clock generator.

Various aspects and features of the disclosure are described in further detail below.

DETAILED DESCRIPTION

Memory devices with good read and write performance are described herein. The memory devices may be for random access memory (RAM), static RAM (SRAM), dynamic RAM (DRAM), synchronous DRAM (SDRAM), video RAM (VRAM), synchronous graphic RAM (SGRAM), read only memory (ROM), Flash memory, etc. The memory devices may be stand-alone devices or may be embedded within other devices, e.g., processors.

Figure 1:
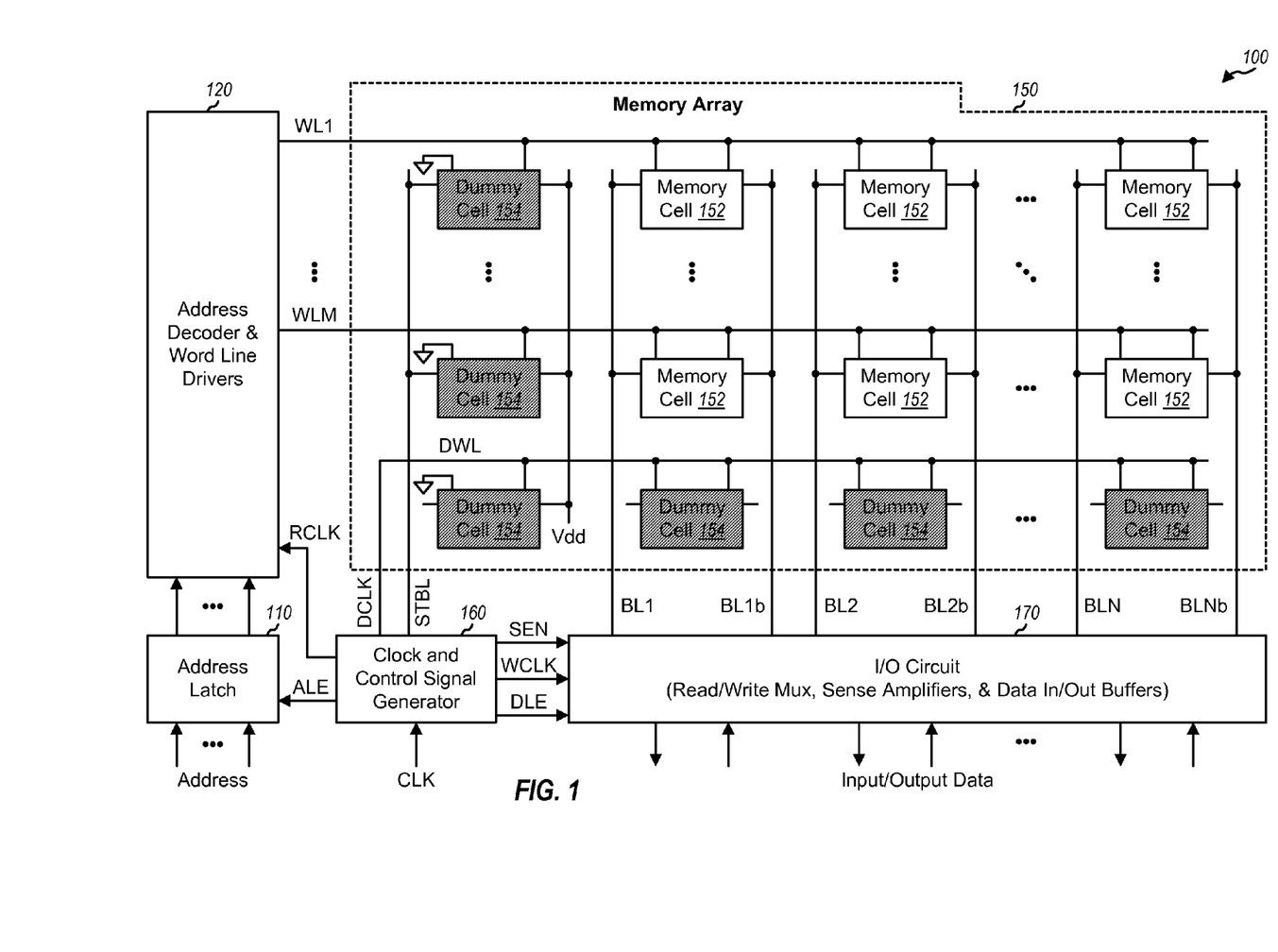
FIG. 1 shows a block diagram of a memory device.

FIG. 1 shows a block diagram of a design of a memory device 100 with good read and write performance. Memory device 100 includes an address latch 110, an address decoder and word line drivers 120, a memory array 150, a clock and control signal generator 160, and an I/O circuit 170.

Memory array 150 includes M rows and N columns of memory cells 152 and further includes one row and one column of dummy cells 154. In general, M and N may each be any value. A memory cell is a circuit that can store a data value and may be implemented with various circuit designs. A dummy cell is a circuit that can store a known value and/or is connected in a particular manner to achieve a desired loading effect. A dummy cell may be implemented with the same or similar circuit design as a memory cell. The M rows of memory cells are selected via M word lines WL1 through WLM. The row of dummy cells is coupled to a dummy word line DWL. The N columns of memory cells are coupled to N differential bit lines BL1 and BL1b through BLN and BLNb. The column of dummy cells is coupled to a self-time bit line STBL.

Address latch 110 receives an address for a memory cell or a block of memory cells to be accessed and latches the address. Address decoder 120 receives the latched address and may generate a row address based on the received address. Address decoder 120 may then perform pre-decoding on the row address and provide pre-decoded signals that indicate a specific word line to activate or assert. Word line drivers 120 receive the pre-decoded signals and drive a specific word line, as indicated by the pre-decoded signals, so that the desired row of memory cells can be accessed.

I/O circuit 170 includes various circuits for reading data from the memory cells and writing data to the memory cells. For example, I/O circuit 170 includes a sense amplifier and a data output buffer for each differential bit line for reading data from the memory cells coupled to that bit line. I/O circuit 170 further includes a data latch and data input drivers for each differential bit line for writing data to the memory cells coupled to that bit line.

Clock and control signal generator 160 receives an external clock signal CLK and is also coupled to the self-timed bit line STBL and the dummy word line DWL. Generator 160 generates clock and control signals used to control the operation of memory device 100, e.g., clock and control signals used for read and write operations. The clock and control signals have timing determined by the column and row of dummy cells, as described below. Generator 160 may generate the following clock and control signals:

RCLK—an internal clock used for word line control for read and write operations,
ALE—an address latch enable signal used for read and write operations,
SEN—a sense amplifier enable signal used only for read operations,
Precharge—a bit line precharge signal used for read and write operations,
DLE—a data latch enable signal used only for write operations, and
WCLK—a data input driver clock used only for write operations.

The clock and control signals and some of the circuit blocks in FIG. 1 are described in further detail below.

Figure 2:
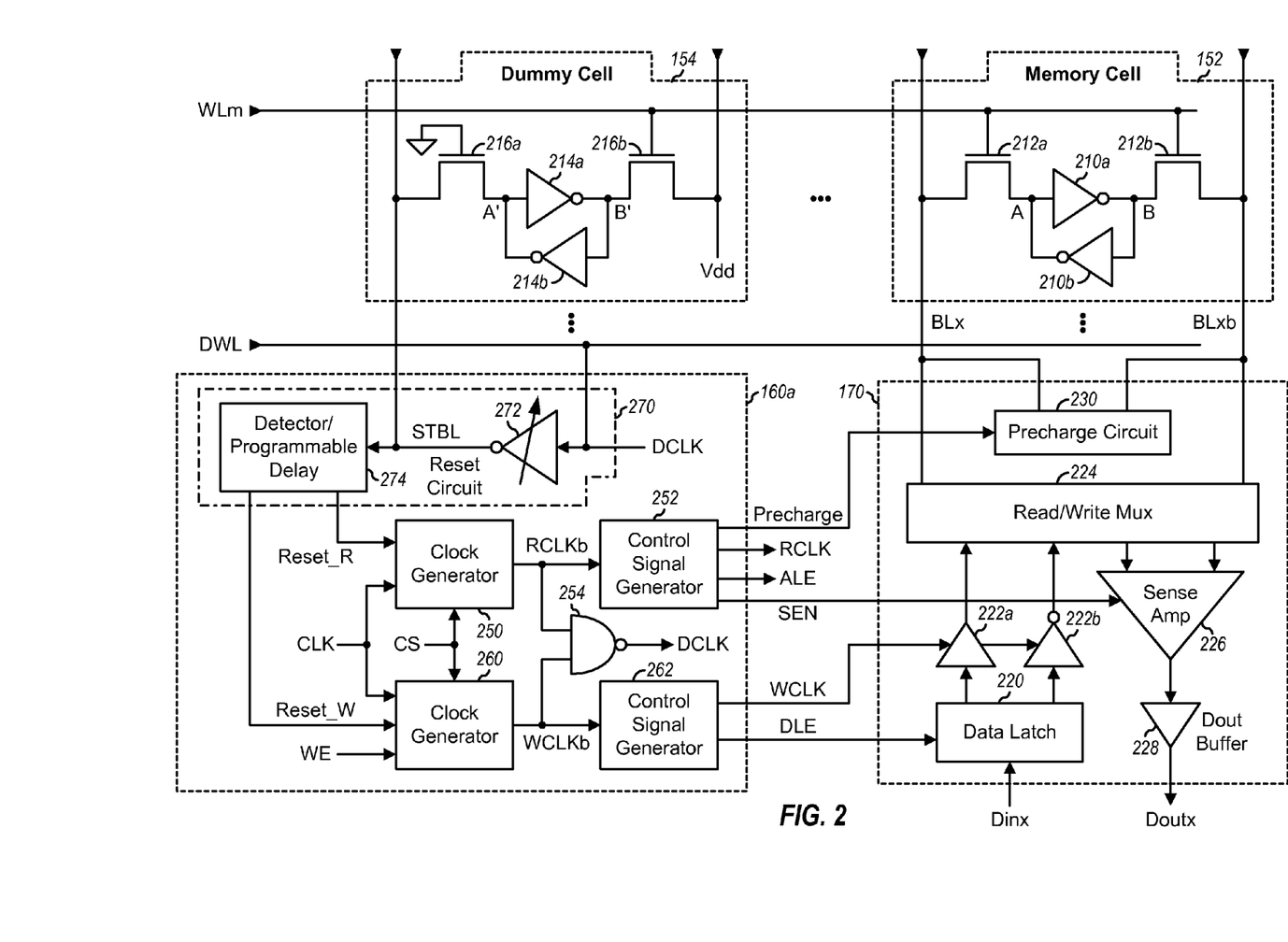
FIG. 2 shows a schematic diagram of a memory array, a clock and control signal generator, and an input/output (I/O) circuit within the memory device in FIG. 1.

FIG. 2 shows a schematic diagram of a design of memory array 150 and I/O circuit 170 in FIG. 1. For clarity, only one memory cell 152 and one dummy cell 154 in memory array 150 is shown in FIG. 2. Furthermore, only the dummy word line DWL is shown in FIG. 2 but not the dummy cells coupled to this word line. Also for clarity, read/write circuitry for only one bit line is shown in FIG. 2.

In the design shown in FIG. 2, memory cell 152 includes a pair of cross-coupled inverters 210a and 210b and a pair of pass transistors 212a and 212b. Each inverter 210 may be formed with a P-channel field effect transistor (P-FET) and an N-channel field effect transistor (N-FET), as is known in the art. Inverter 210a has its input coupled to a node A and its output coupled to a node B. Inverter 210b has its input coupled to node B and its output coupled to node A. Each pass transistor 212 is implemented with an N-FET. N-FET 212a has its drain coupled to node A, its gate coupled to a word line WLm, and its source coupled to a bit line BLx, where $m \in \{1, \ldots, M\}$ and $x \in \{1, \ldots, N\}$ N-FET 212b has its drain coupled to node B, its gate coupled to word line WLm, and its source coupled to a complementary bit line BLxb.

Inverters 210a and 210b store a data value via positive feedback. If memory cell 152 stores logic high ('1'), node A is at logic high and node B is at logic low. If memory cell 152 stores logic low ('0'), node A is at logic low and node B is at logic high. For a memory read, lines BLx and BLxb are initially precharged to logic high by a precharge circuit 230, then word line WLm is asserted to logic high, and N-FETs 212a and 212b are turned on. If memory cell 152 stores logic high, then bit line BLx is charged by inverter 210b via N-FET 212a, and complementary bit line BLxb is discharged by inverter 210a via N-FET 212b. The converse is true if memory cell 152 stores logic low. A sense amplifier 226 detects the voltage difference between lines BLx and BLxb to determine the data value stored in memory cell 152.

For a memory write, lines BLx and BLxb are initially precharged to logic high by precharge circuit 230, then word line WLm is asserted to logic high, and N-FETs 212a and 212b are turned on. To write logic high ('1') to memory cell 152, bit line BLx is driven high and forces node A to logic high via N-FET 212a, and complementary bit line BLxb is driven low and forces node B to logic low via N-FET 212b. The converse of the above is true when writing logic low to memory cell 152.

In the design shown in FIG. 2, dummy cell 154 includes inverters 214a and 214b and N-FETs 216a and 216b that are coupled as described above for inverters 210a and 210b and N-FETs 212a and 212b in memory cell 152, albeit with the following differences. N-FET 216a has its gate coupled to circuit ground and its source coupled to the self-timed bit line STBL. N-FET 216b has its drain coupled to a power supply voltage, Vdd. In this design, N-FET 216a is always turned off, node A' is at logic low, and node B' is at logic high.

Dummy cells 154 in memory array 150 may be implemented with the same structure and size as regular memory cells 152. The self-timed bit line STBL for the column of dummy cells 154 may then have the same loading as each of the N bit lines BL1 to BLN. The dummy word line DWL for the row of dummy cells 154 may also have the same loading as each of the M word lines WL1 to WLM. Clock and control signals used for read and write operations may be generated with the self-timed bit line STBL and the dummy word line DWL and may then track the timing of memory cells 152.

In the design shown in FIG. 2, for each bit line, I/O circuit 170 includes a data latch 220, data input drivers 222a and 222b, a read/write multiplexer (Mux) 224, sense amplifier 226, and an output data (Dout) buffer 228. Multiplexer 224 couples lines BLx and BLxb to drivers 222a and 222b for write operations and to sense amplifier 226 for read operations. For a write operation, latch 220 receives and latches an input data value Dinx based on the DLE signal. Data input drivers 222a and 222b receive the latched data value and drive lines BLx and BLxb, respectively, when enabled by the WCLK signal. For a read operation, sense amplifier 226 amplifies the voltage difference between lines BLx and BLxb, detects a logic value (e.g., either logic low or high) for the amplified voltage when enabled by the SEN signal, and provides the detected logic value. Buffer 228 buffers the output of sense amplifier 226 and provides an output data value Doutx. Precharge circuit 230 generates signals that precharge lines BLx and BLxb to logic high prior to each read and write operation.

Generator 160 uses dummy cells 154 to generate the clock and control signals for read and write operations. In the design shown in FIG. 2, generator 160 generates a window/pulse on an internal clock (DCLK) signal for each read and write operation. The width of the window on the DCLK signal is determined by dummy cells 154 and may also be adjusted via programmable means to achieve good timing margins for both read and write operations. Various clock and control signals are generated with timing determined by the DCLK signal, as described below.

FIG. 2 also shows a clock and control signal generator 160a, which is one design of clock and control signal generator 160 in FIG. 1. In this design, generator 160a includes clock generators 250 and 260, control signal generators 252 and 262, a reset circuit 270, and a power-on reset circuit composed of a NAND gate 254. Clock generator 250 is operational for both read and write operations and generates an RCLKb signal. Clock generator 260 is operational only for write operations and generates a WCLKb signal. Control signal generator 252 receives the RCLKb signal and generates the RCLK signal used to enable the M word lines WL1 through WLM, the ALE signal for address latch 110, the SEN signal for sense amplifier 226, and the Precharge signal for precharge circuit 230. Control signal generator 262 receives the WCLKb signal and generates the WCLK clock for data input drivers 222a and 222b and the DLE signal for data input latch 220. Clock generators 250 and 260 and control signal generators 252 and 262 may be implemented as described below.

NAND gate 254 receives the RCLKb and WCLKb signals from clock generators 250 and 260, respectively, and provides the DCLK signal to reset circuit 270 and the dummy word line DWL. The DCLK signal observes loading similar to that on a normal word line. Within reset circuit 270, an inverting driver 272 receives the DCLK signal and drives the self-timed bit line STBL. Driver 272 has configurable drive strength that may be set to generate a desired window width on the DCLK signal. A detector/programmable delay circuit 274 detects a STBL signal on the self-timed bit line and generates Reset_R and Reset_W signals for clock generators 250 and 260, respectively. Circuit 274 may also provide a programmable delay for the Reset_R and Reset_W signals, which may be used to obtain a longer window on the DCLK signal.

Figure 3:
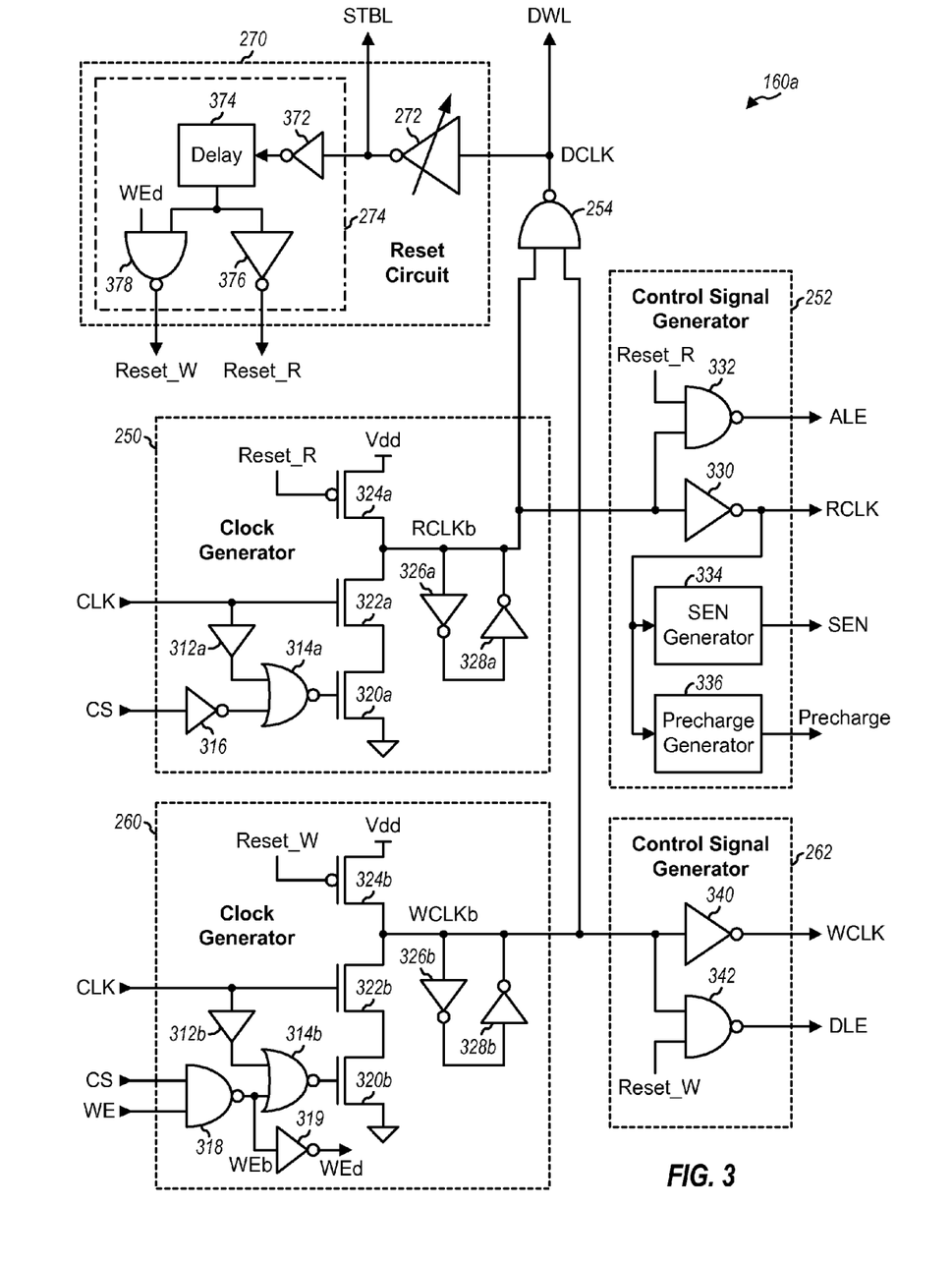
FIG. 3 shows a schematic diagram of a clock and control signal generator with two clock generators and two control signal generators.

FIG. 3 shows a schematic diagram of a design of clock generators 250 and 260 and control signal generators 252 and 262 in FIG. 2. Clock generator 250 receives the CLK signal, a chip select (CS) signal, and the Reset_R signal and generates the RCLKb signal used for both read and write operations. The CS signal is at logic high when memory device 100 is enabled and is at logic low otherwise. Clock generator 260 receives the CLK signal, the CS signal, a write enable (WE) signal, and the Reset_W signal and generates the WCLKb signal used for write operations.

Within clock generator 250, a buffer 312a receives the CLK signal and provides a delayed CLK signal. Buffer 312a may be implemented with two or more inverters coupled in series. An inverter 316 receives the CS signal and provides a CSb signal. A NOR gate 314a receives the delayed CLK signal and the CSb signal at two inputs and provides an inverted and delayed version of the CLK signal when memory device 100 is enabled. N-FETs 320a and 322a and a P-FET 324a are coupled in a stacked configuration. N-FET 320a has its source coupled to circuit ground, its gate coupled to the output of NOR gate 314a, and its drain coupled to the source of N-FET 322a. N-FET 322a has its gate receiving the CLK signal and its drain coupled to the drain of P-FET 324a and providing the RCLKb signal. P-FET 324a has its gate receiving the Reset_R signal from reset circuit 270 and its source coupled to the power supply. Inverters 326a and 328a are coupled in series, with the input of inverted 326a receiving the RCLKb signal, the input of inverted 328a coupled to the output of inverter 326a, and the output of inverter 328a coupled to the input of inverter 326a.

Within control signal generator 252, an inverter 330 receives the RCLKb signal and provides the RCLK signal. A NAND gate 332 receives the RCLKb signal and the Reset_R signal at two inputs and provides the ALE signal. A SEN generator 334 receives the RCLK signal and generates the SEN signal for sense amplifier 226. A Precharge generator 336 also receives the RCLK signal and generates the Precharge signal for precharge circuit 230.

Within clock generator 260, a NAND gate 318 receives the CS signal and the WE signal and provides a WEb signal that is at logic low for write operations and at logic high otherwise. An inverter 319 receives the WEb signal and provides a WEd signal. A buffer 312b, a NOR gate 314b, N-FETs 320b and 322b, a P-FET 324b, and inverters 326b and 328b are coupled in the same manner as buffer 312a, NOR gate 314a, N-FETs 320a and 322a, P-FET 324a, and inverters 326a and 328a, respectively, within clock generator 250, with the following differences. NOR gate 314b receives the delayed CLK signal from buffer 312b and the WEb signal from NAND gate 318. P-FET 324b receives the Reset_W signal at its gate and provides the WCLKb signal at its drain.

Within control signal generator 262, an inverter 340 receives the WCLKb signal and provides the WCLK signal. A NAND gate 342 receives the WCLKb signal and the Reset_W signal at two inputs and provides the DLE signal.

Within detector/programmable delay circuit 274, an inverter 372 receives the STBL signal and provides an inverted STBL signal. A delay unit 374 receives the output of inverter 372 and provides a Reset signal. An inverter 376 receives the Reset signal and provides the Reset_R signal for clock generator 250. A NAND gate 378 receives the Reset signal and the WEb signal from NAND gate 318 and provides the Reset_W signal for clock generator 260.

Figure 4:
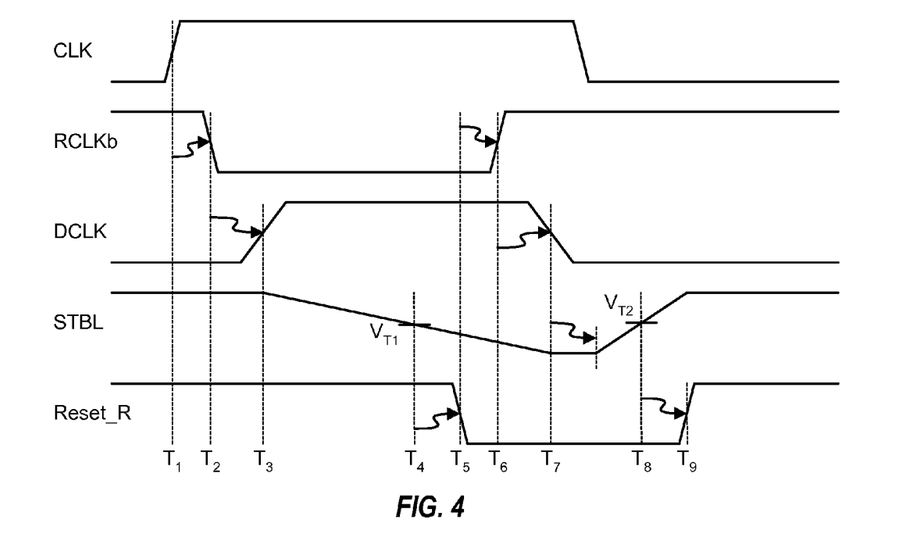
FIG. 4 shows a timing diagram for one clock generator in FIG. 3.

FIG. 4 shows a timing diagram that illustrates the operation of clock generator 250 in FIG. 3. The CS signal is at logic high to enable memory device 100, the Reset_R signal is initially at logic high, and the WCLKb signal is at logic high. Prior to time $T_1$, the CLK signal is at logic low, N-FET 320a is turned on, and N-FET 322a is turned off. The CLK signal transitions from logic low to logic high at time $T_1$. N-FET 322a is then turned on and pulls the RCLKb signal to logic low at time $T_2$, which then causes the DCLK signal to transition to logic high at time $T_3$. The rising edge on the CLK signal thus generates a rising edge on the DCLK signal. N-FET 320a is turned off a brief delay after time $T_1$ by the logic high on the CLK signal, and inverters 326a and 328a act as a keeper circuit that maintains the logic low for the RCLKb signal.

The self-timed bit line STBL is initially precharged to logic high prior to a read or write operation. The rising edge on the DCLK signal, which rises slower than other control signals because of the loading due to the dummy word line DWL, activates the self-time delay tracking mechanism implemented with dummy cells 154. Inverting driver 272 drives the self-timed bit line STBL toward logic low upon receiving the rising edge on the DCLK signal. The speed/rate at which the self-timed bit line STBL is pulled down is determined by the loading on this bit line as well as the drive strength of driver 272, which may be varied as described below to achieve the desired read and write timing margins. The self-timed bit line has loading due to the column of dummy cells 154 and mimics the loading on regular bit line BLx due to a column of memory cells 152. Circuit 274 detects when the self-timed bit line crosses below a first threshold voltage $V_{T1}$ at time $T_4$ and generates a falling edge on the Reset_R signal at time $T_5$. Circuit 274 may further delay the falling edge on the Reset_R signal by a programmable amount, as described below. P-FET 324a is turned on by the logic low on the Reset_R signal and pulls the RCLKb signal to logic high at time $T_6$, which then causes the DCLK signal to transition to logic low at time $T_7$. The falling edge on the Reset_R signal thus generates a falling edge on the DCLK signal.

Inverting driver 272 drives the self-timed bit line STBL toward logic high upon receiving the falling edge on the DCLK signal. Inverting driver 272 pulls down the self-timed bit line at a slow rate using relatively weak pull-down transistors that mimic the worst-case transistors in memory cells 152. Inverting driver 272 pulls up the self-timed bit line at a faster rate with relatively strong pull-up transistors. Circuit 274 detects when the self-timed bit line crosses above a second threshold voltage $V_{T2}$ at time $T_8$ and generates a rising edge on the Reset_R signal at time $T_9$. The pulse width of the DCLK signal may be varied by controlling the drive strength of inverting driver 272 and/or by selecting an appropriate amount of delay in circuit 274 to achieve good timing margins for both read and write operations.

Referring back to FIG. 3, clock generator 260 operates in similar manner as clock generator 250 when enabled by the WE signal. When the WE signal is at logic high for write operations, the WEb signal is at logic low, the output of NOR gate 314b is dependent on the delayed CLK signal from buffer 312b, and clock generator 260 is operational. The logic low on the WEb signal also results in logic high on the WEd signal, which allows NAND gate 378 to provide an inverted version of the Reset signal as the Reset_W signal. Conversely, when the WE signal is at logic low for read operations, the WEb signal is at logic high, the output of NOR gate 314b is maintained at logic low, N-FET 320b is turned off, and clock generator 260 is disabled. The logic high on the WEb signal also results in logic low on the WEd signal, which causes the output of NAND gate 378 to remain at logic high. In write operations, NAND gate 378 acts as an inverter for the Reset signal from delay unit 374. In read operations, the Reset_W signal remains at logic high, the WCLKb signal also remains at logic high, and the DLE signal remains at logic low.

NAND gate 254 generates the DCLK signal based on the RCLKb and WCLKb signals. When clock generator 260 is enabled, the rising edge on the DCLK signal is determined by the earlier of the falling edges on the RCLKb and WCLKb signals, and the falling edge on the DCLK signal is determined by the later of the rising edges on the RCLKb and WCLKb signals. Clock generators 250 and 260 may be matched so that the WCLKb signal closely matches the RCLKb signal. When clock generator 260 is disabled, the WCLKb signal is at logic high, and the DCLK signal is determined based solely by the RCLKb signal.

Power-on reset is an important issue in memory design. After being powered on, clock generators 250 and 260 should reset to a non-active/disabled mode. NAND gate 254 ensures that the RCLKb and WCLKb signals both reset to logic high and stay at logic high until the next edge on the CLK signal arrives. If either the RCLKb or WCLKb signal wakes up at logic low, then the DCLK signal will be at logic high, inverting driver 272 will pull the STBL signal to logic low, and the Reset_R and Reset_W signal will transition to logic low and reset both of the RCLKb and WCLKb signals to logic high. NAND gate 254 thus ensures that the RCLKb and WCLKb signals automatically reset to logic high after power on or when an address is out of range. This automatic reset may avoid a situation in which an internal clock is stuck at an active mode at power on and causes leakage current or memory functional failure.

Figure 5:
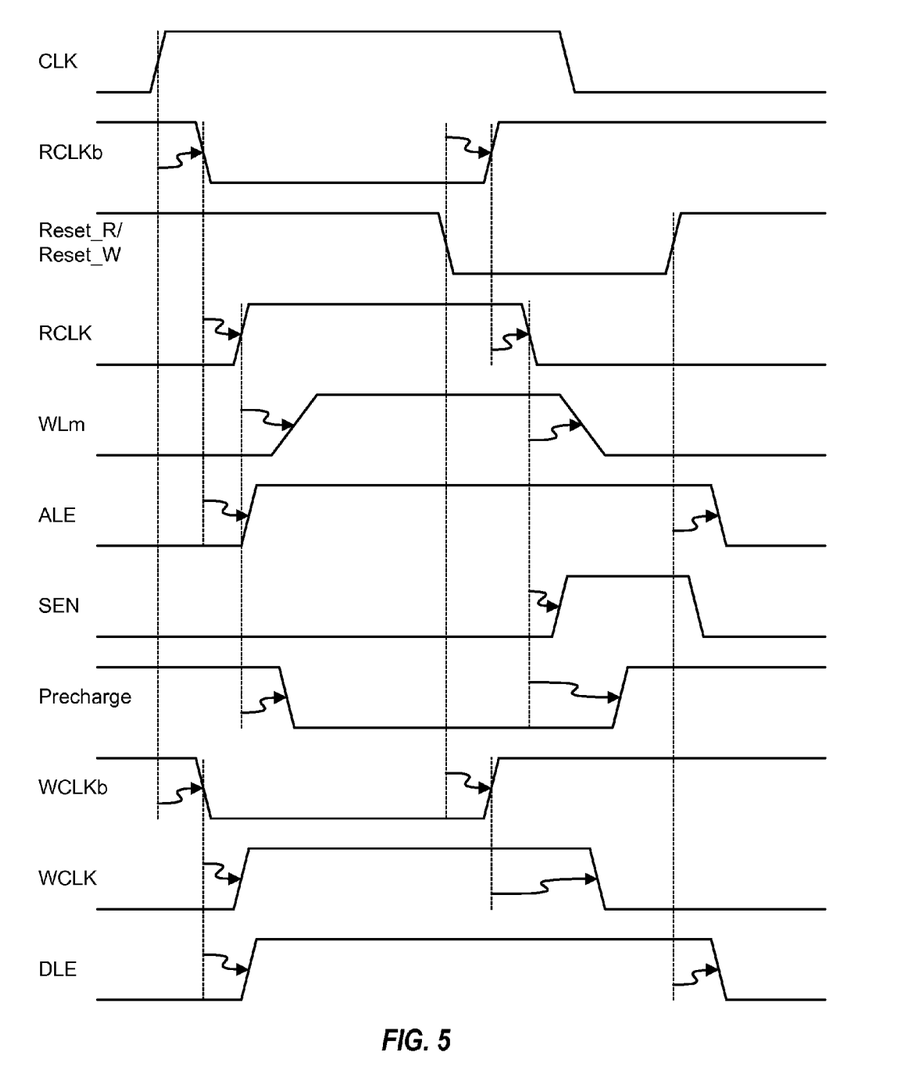
FIG. 5 shows various control signals used for read and write operations.

FIG. 5 shows a timing diagram that illustrates generation of various clock and control signals used for read and write operations. For simplicity, clock generators 250 and 260 are assumed to be matched, the RCLKb and WCLKb signals are matched, and the Reset_R and Reset_W signals are also matched. The RCLKb, DCLK, STBL, and Reset_R signals are generated as described above for FIG. 4.

NAND gate 332 generates the ALE signal based on the RCLKb and Reset_R signals. The ALE signal has a pulse width determined by the low pulse on the RCLKb signal and also the low pulse on the Reset_R signal. The ALE signal is used by address latch 110 in FIG. 1 to latch an address.

Inverter 330 generates the RCLK signal, which is a delayed and inverted version of the RCLKb signal. The RCLK signal may be used to assert word line WLm for a selected row of memory cells. The active duration of word line WLm may be determined by (e.g., set equal to) the window on the RCLK signal. For example, word line WLm may be asserted by the rising edge on the RCLK signal and de-asserted by the falling edge on the RCLK signal. Word line WLm turns on N-FETs 212a and 212b in memory cell 152, as shown in FIG. 2. For a read operation, the active duration of word line WLm determines the amount of time that memory cell 152 can discharge lines BLx and BLxb. For a write operation, the active duration of word line WLm determines the amount of time allowed to write data to memory cell 152. Word line WLm may be asserted for different durations for read and write operations, as described below.

For a read operation, SEN generator 334 generates a pulse on the SEN signal based on a falling edge on the RCLK signal. This pulse may be used to enable sense amplifier 226 in FIG. 2 to detect the voltage difference between lines BLx and BLxb.

For a write operation, clock generator 260 is enabled, and the WCLKb signal is generated in the same manner as the RCLKb signal. Inverter 340 generates the WCLK signal, which is a delayed and inverted version of the WCLKb signal. The WCLK signal is used to enable data input drivers 222a and 222b in FIG. 2. NAND gate 342 generates the DLE signal based on the WCLKb and Reset_W signals. The ALE signal has a pulse width determined by the low pulse on the WCLKb signal and also the low pulse on the Reset_W signal. The DLE signal has similar timing as the ALE signal and is used by data latch 220 in FIG. 2 to latch the input data.

Precharge circuit 230 in FIG. 2 generates a Precharge signal that precharges lines BLx and BLxb to logic high prior to each read and write operation. The Precharge signal is disabled while lines BLx and BLxb are driven by either the selected memory cell during a memory read or data input buffers 222a and 222b during a memory write. The Precharge signal may be generated based on the RCLK signal and may have rising and falling edges determined by those on the RCLK signal.

The design shown in FIGS. 2 and 3 with two clock generators may provide various advantages. First, the design has small delays from the external CLK signal to the internal RCLK and WCLK signals and may be used for high performance memory devices operating with fast clock speed and narrow setup and hold time windows. The delay from the CLK signal to the RCLK signal is two gates—one gate for N-FETs 320a and 322a and P-FET 324a and another gate for inverter 330. The delay from the CLK signal to the WCLK signal is also two gates—one gate for N-FETs 320b and 322b and P-FET 324b and another gate for inverter 340. The small delays for the RCLK and WCLK signals support fast read and write operations. Second, clock generator 260 may be disabled during read operations to reduce power consumption. The WCLK and ALE signals are used only for write operations, and clock generator 260 may be enabled during write operations to generate these signals.

Figure 6:
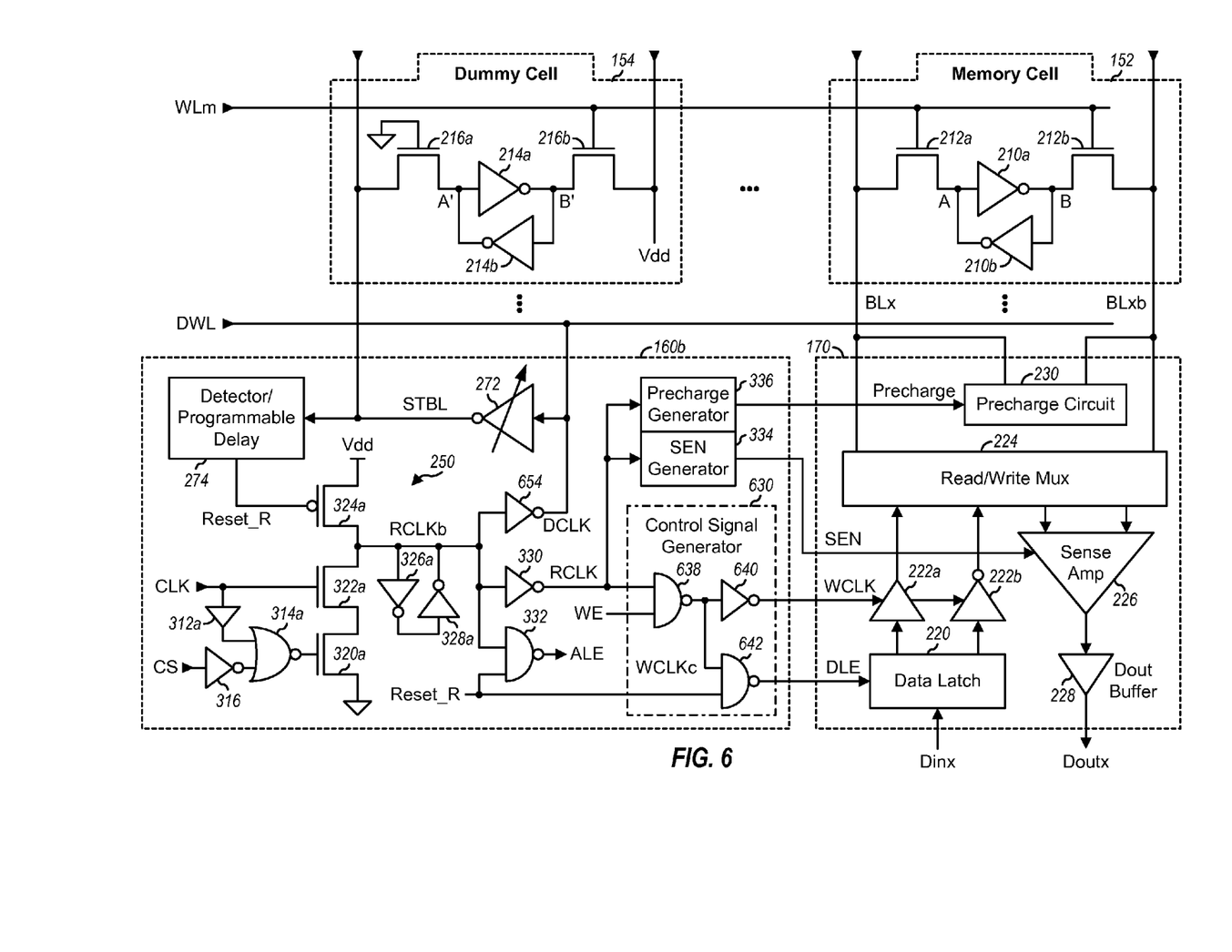
FIG. 6 shows a schematic diagram of another clock and control signal generator with one clock generator and two control signal generators.

FIG. 6 shows a schematic diagram of a clock and control signal generator 160b, which is another design of clock and control signal generator 160 in FIG. 1. Generator 160b includes clock generator 250 and control signal generator 252 that are coupled as shown in FIG. 3. Generator 160b further includes a control signal generator 630 for write operations. Control signal generator 630 includes NAND gates 638 and 642 and an inverter 640. NAND gate 638 receives the RCLK signal and the WE signal at two inputs and provides a WCLKc signal, which is enabled only for write operations. Inverter 640 receives the WCLKc signal and provides the WCLK signal. NAND gate 642 receives the WCLKc signal and the Reset_R signal at two inputs and provides the DLE signal. An inverter 654 receives the RCLKb signal and provides the DCLK signal for driver 272. Inverter 654 replaces NAND gate 254 in FIGS. 2 and 3.

In the design shown in FIG. 6, the WCLKc signal is generated based on the RCLK signal only during write operations. The WCLKc signal is then used to generate the WCLK and DLE signals in the same manner as shown in FIG. 3. In comparison to the design shown in FIG. 3, the WCLK signal in FIG. 6 observes two additional gate delays through NAND gate 638 and inverter 640, and the DLE signal also observes two additional gate delays through NAND gates 638 and 642. The two additional gate delays for the WCLK and DLE signals are avoided in the design shown in FIGS. 2 and 3 by using two clock generators and by applying the WE signal at NAND gate 318 prior to the CLK signal instead of at NAND gate 638 after the CLK signal.

Figure 7:
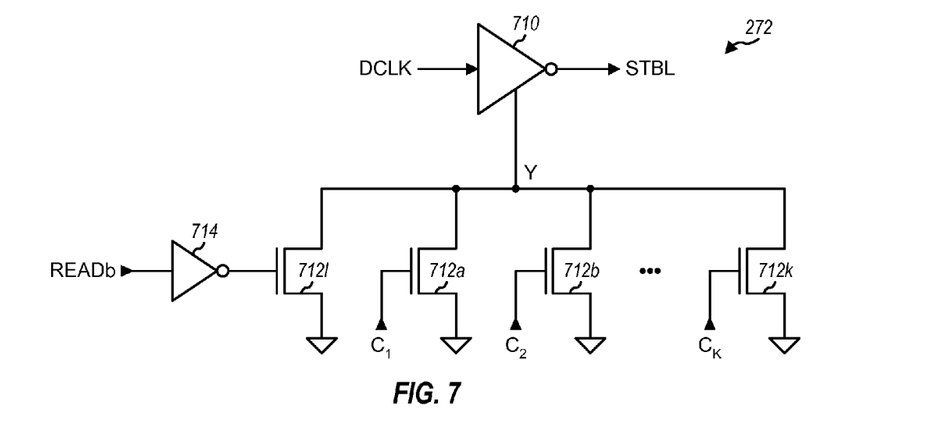
FIG. 7 shows a schematic diagram of a driver with configurable drive strength.

FIG. 7 shows a schematic diagram of a design of inverting driver 272 in FIGS. 2, 3 and 6. Within inverting driver 272, an inverter 710 receives the DCLK signal and drives the self-timed bit line STBL. The pull-down for inverter 710 is provided by N-FETs 712a through 712l. Each N-FET 712 has its drain coupled to a pull-down node Y for inverter 710 and its source coupled to circuit ground. An inverter 714 receives a complementary read (READb) signal and drives the gate of N-FET 712l. The gates of N-FETs 712a through 712k receive K accelerator control signals $C_1$ through $C_K$, respectively, where K may be any integer value, e.g., K=16.

Each N-FET 712 may be turned on to provide more pull-down for inverter 710, which would then increase the drive strength of inverter 710 and consequently shorten the window on the DCLK signal. N-FET 712l is turned on for each read operation. A sufficient number of N-FETs among N-FETs 712a through 712k may also be turned on for each read operation, as determined by an accelerator setting, to obtain the desired read timing margin. N-FET 712l may be turned off for each write operation, which would then result in less drive strength for inverter 710 and a wider pulse on the DCLK signal. N-FET 712l may be designed to provide a suitable amount of extra time (e.g., 200 pico seconds) for a write operation to achieve the desired write timing margin.

Figure 8:
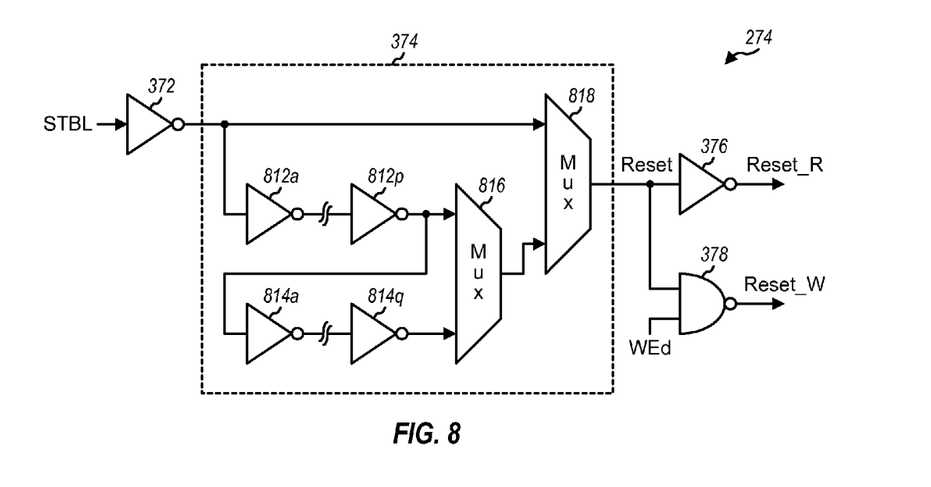
FIG. 8 shows a schematic diagram of a programmable delay circuit.

FIG. 8 shows a schematic diagram of a design of circuit 274 in FIGS. 2, 3 and 6. In this design, circuit 274 includes inverter 372 that receives the analog STBL signal on the self-timed bit line and provides a corresponding digital signal. Inverter 372 detects when the STBL signal crosses below the $V_{T1}$ threshold and provides a falling edge at its output, as shown in FIG. 4. Inverter 372 also detects when the STBL signal exceeds the $V_{T2}$ threshold and provides a rising edge at its output, as also shown in FIG. 4.

The output of inverter 372 is provided to programmable delay unit 374 formed with inverters 812a through 812p and inverters 814a through 814q, which are coupled in series. Inverter 812a receives the output of inverter 372, and inverters 812p and 814q provide their outputs to a multiplexer 816. Multiplexer 816 provides the output of either inverter 812p or 814q to a multiplexer 818. Multiplexer 818 provides the output of either inverter 372 or multiplexer 816 as the Reset signal.

In the design shown in FIG. 8, three different delays may be selected for the Reset signal. The shortest delay is obtained by providing the output of inverter 372 via multiplexer 818 as the Reset signal. A medium delay is obtained by providing the output of inverter 372 via inverters 812a through 812p and multiplexers 816 and 818 as the Reset signal. The longest delay is obtained by providing the output of inverter 372 via inverters 812a through 812p, inverters 814a through 814q, and multiplexers 816 and 818 as the Reset signal. The programmable delay may be used to extend the window on the DCLK signal when selecting the minimum number of N-FETs 712 in inverting driver 272 does not provide a sufficiently long window on the DCLK signal.

The techniques described herein may be used to combat timing variations due to PVT. The techniques may be used to obtain the desired read and write timing margins across PVT variations and for various memory configurations in order to achieve good performance and high yield. The desired timing margin may be obtained with the self-timed tracking scheme (which can track memory cell delay) and the programmable accelerator and/or delay (which can provide the desired amount of timing margin).

In the designs shown in FIGS. 2, 3 and 6, the ALE and DLE signals are conveniently generated with few gates based on other control signals. To ensure proper read and write operations, address latch 110 and data latch 220 should be kept closed until an entire read or write cycle is completed. Therefore, the pulse widths of the ALE and DLE signals should be extended to cover the pulse width of word line WLm. One-shot circuits may be used to extend the pulse widths of the ALE and DLE signals. A one-shot circuit generates a pulse of a fixed duration for each rising edge of an input signal, with the fixed pulse duration being determined by a delay circuit within the one-shot circuit. The one-shot circuits for the ALE and DLE signals may require a large number of inverters in the delay circuits in order to obtain pulse widths that are sufficiently long for all memory configurations and PVT variations. With the designs shown in FIGS. 2, 3 and 6, the Reset_R and Reset_W signals from the self-timed bit line are efficiently used to extend the pulse widths of the ALE and DLE signals to cover an entire write or read operation including the pulse width of word line WLm. This ensures that address latch 110 and data latch 220 will not be opened until the entire read or write cycle is completed, for all memory configurations and PVT conditions. The designs in FIGS. 2, 3 and 6 can thus generate the ALE and DLE signals using fewer gates and less IC die area in comparison to a design using one-shot circuits.

Figure 9:
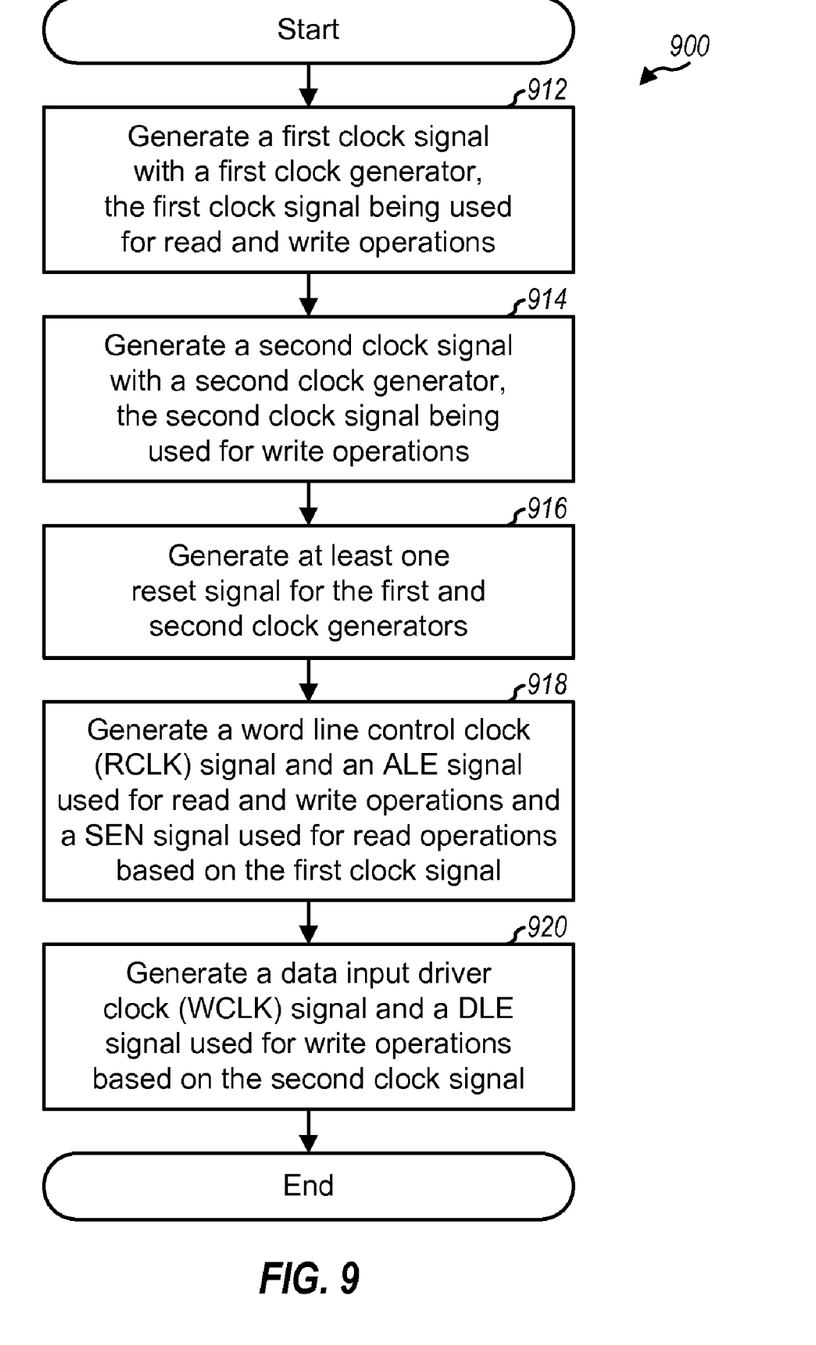
FIG. 9 shows a process for generating clock and control signals.

FIG. 9 shows a design of a process 900 for generating clock and control signals in a memory device. A first clock signal may be generated with a first clock generator and used for read and write operations (block 912). A second clock signal may be generated with a second clock generator and used for write operations (block 914). Each clock signal may have leading edges generated based on an external clock signal (e.g., the CLK signal) and trailing edges generated based on a reset signal (e.g., the Reset_R or Reset_W signal). The logic level of each clock signal may be maintained by a keeper circuit during the time between the leading and trailing edges. The first and second clock signals may be generated with equal delays. The second clock signal may be disabled for read operations, e.g., by disabling the second clock generator. The first and second clock signals may also be reset to a known logic level at power on with a power-on reset circuit (e.g., NAND gate 254).

At least one reset signal may be generated for the first and second clock generators with a reset circuit (block 916). The memory device may have a memory array comprising memory cells and dummy cells. The reset signal(s) may have timing determined based on loading on a bit line for a column of dummy cells and/or loading on a word line for a row of dummy cells. The reset signal(s) may have a first delay for read operations and a second delay for write operations. Different delays for read and write operations may be obtained with a driver having configurable drive strength and/or a delay unit having programmable delay.

A word line control clock (RCLK) signal and an ALE signal used for read and write operations and a SEN signal used for read operations may be generated by a first control signal generator based on the first clock signal (block 918). A data input driver clock (WCLK) signal and a DLE signal used for write operations may be generated by a second control signal generator based on the second clock signal (block 920). The RCLK and WCLK signals may be generated with equal delays based on the first and second clock signals, respectively. The ALE and DLE signals may be generated with equal delays and possibly equal pulse widths, e.g., without using one-shot circuits. The ALE signal may be generated based on the first clock signal and a reset signal for the first clock generator. The DLE signal may be generated based on the second clock signal and a reset signal for the second clock generator.

The memory devices described herein may be used for various applications such as wireless communication, computing, networking, personal electronics, etc. The memory devices may be implemented as stand-alone devices or embedded within processors, digital signal processors (DSPs), reduced instruction set computer (RISC) processors, advanced RISC machine (ARM) processors, graphics processors, graphics processing units (GPUs), controllers, microprocessors, etc. An exemplary use of the memory devices for a wireless communication device is described below.

Figure 10:
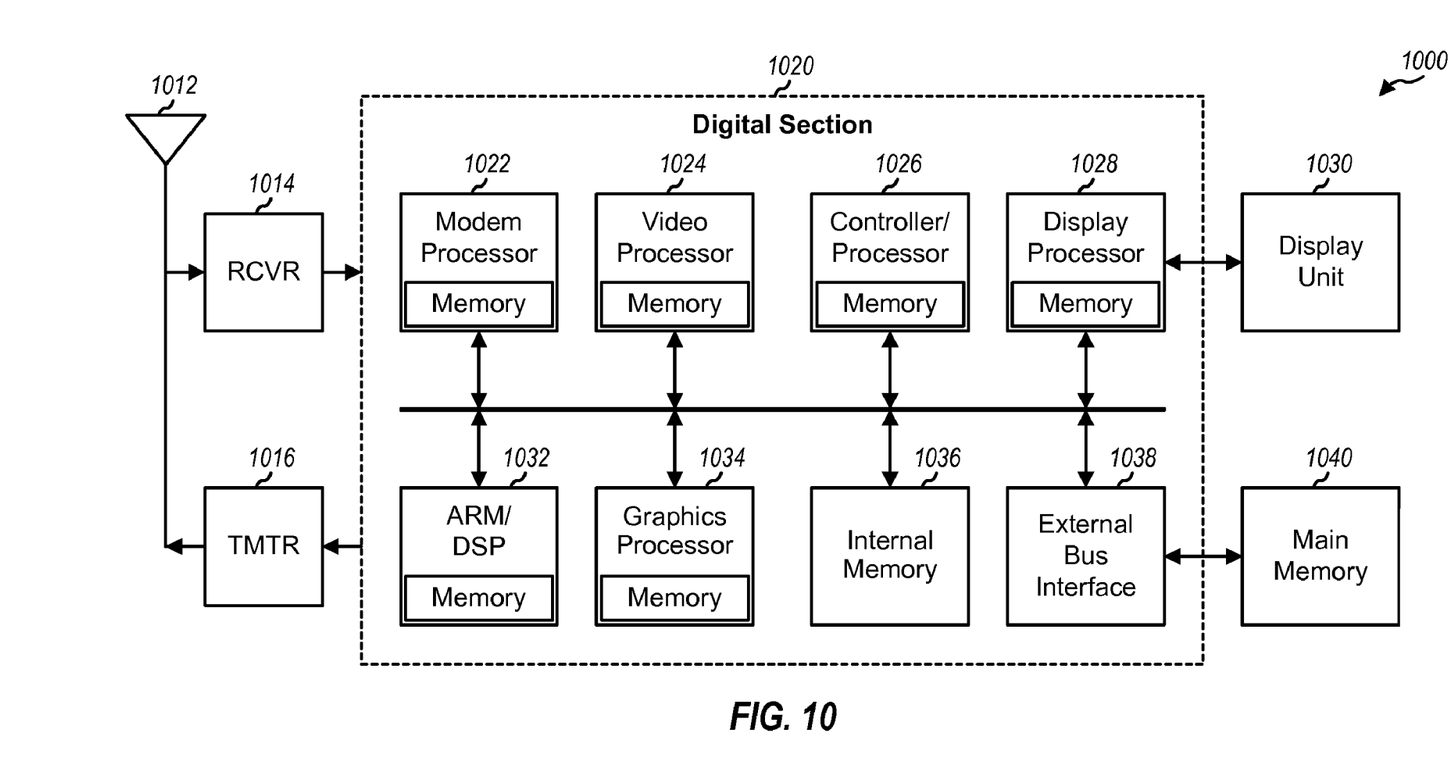
FIG. 10 shows a block diagram of a wireless communication device.

FIG. 10 shows a block diagram of a wireless device 1000 in a wireless communication system. Wireless device 1000 may be a cellular phone, a terminal, a handset, a PDA, a wireless modem, etc. The wireless communication system may be a Code Division Multiple Access (CDMA) system, a Global System for Mobile Communications (GSM) system, or some other system.

Wireless device 1000 is capable of providing bi-directional communication via a receive path and a transmit path. On the receive path, signals transmitted by base stations are received by an antenna 1012 and provided to a receiver (RCVR) 1014. Receiver 1014 conditions and digitizes the received signal and provides samples to a digital section 1020 for further processing. On the transmit path, a transmitter (TMTR) 1016 receives data to be transmitted from digital section 1020, processes and conditions the data, and generates a modulated signal, which is transmitted via antenna 1012 to the base stations.

Digital section 1020 includes various processing, interface and memory units such as, for example, a modem processor 1022, a video processor 1024, a controller/processor 1026, a display processor 1028, an ARM/DSP 1032, a graphics processor 1034, an internal memory 1036, and an external bus interface (EBI) 1038. Modem processor 1022 performs processing for data transmission and reception, e.g., encoding, modulation, demodulation, and decoding. Video processor 1024 performs processing on video content (e.g., still images, moving videos, and moving texts) for video applications such as camcorder, video playback, and video conferencing. Controller/processor 1026 may direct the operation of various units within digital section 1020. Display processor 1028 performs processing to facilitate the display of videos, graphics, and texts on a display unit 1030. ARM/DSP 1032 may perform various types of processing for wireless device 1000. Graphics processor 1034 performs graphics processing, e.g., for graphics, video games, etc. Internal memory 1036 stores data and/or instructions for various units within digital section 1020. EBI 1038 facilitates transfer of data between digital section 1020 (e.g., internal memory 1036) and a main memory 1040.

Each of processors 1022 through 1034 may include an embedded memory, which may be implemented as described above. Internal memory 1036 and main memory 1040 may also be implemented as described above. Digital section 1020 may be implemented with one or more application specific integrated circuits (ASICs) and/or some other type of ICs.

The techniques and memory devices described herein may be implemented in various hardware units such as a memory IC, an ASIC, a DSP, a digital signal processing device (DSPD), a programmable logic device (PLD), a field programmable gate array (FPGA), a controller, a processor, and other electronic devices. The hardware units may be fabricated in various IC process technologies such as CMOS, N-MOS, P-MOS, bipolar-CMOS (Bi-CMOS), bipolar, etc. CMOS technology can fabricate both N-FETs and P-FETs on the same IC die, whereas N-MOS technology can only fabricate N-FETs and P-MOS technology can only fabricate P-FETs. The hardware units may be fabricated with any device size technology, e.g., 130 nanometer (nm), 90 nm, 65 nm, 30 nm, etc.

An apparatus implementing the techniques described herein may be a stand-alone unit or may be part of a device. The device may be (i) a stand-alone IC, (ii) a set of one or more ICs that may include memory ICs for storing data and/or instructions, (iii) an ASIC such as a mobile station modem (MSM), (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit comprising:
a first clock generator configured to generate a first clock signal used for memory read and memory write operations; and
a second clock generator configured to generate a second clock signal used for memory write operations and not used for memory read operations,
wherein the second clock generator is disabled when memory read operations are performed; and
wherein the first clock generator comprises a first circuit configured to generate leading edges on the first clock signal based on an external clock signal and to generate trailing edges on the first clock signal based on a reset signal.

2. The integrated circuit of claim 1, wherein the first clock generator further comprises a second circuit configured to maintain logic level of the first clock signal between the leading and trailing edges triggered by the external clock signal and the reset signal.

3. The integrated circuit of claim 1, wherein the first and second clock generators are configured to generate the first and second clock signals with equal delays.

4. The integrated circuit of claim 1, further comprising:
a first control signal generator configured to receive the first clock signal and generate a word line control clock (RCLK) signal and an address latch enable (ALE) signal used for read and write operations.

5. The integrated circuit of claim 4, wherein the first control signal generator is configured to generate the ALE signal based on the first clock signal and a reset signal for the first clock generator.

6. The integrated circuit of claim 4, wherein the first control signal generator is configured to further generate a sense amplifier enable (SEN) signal used for read operations.

7. The integrated circuit of claim 4, further comprising:
a second control signal generator configured to receive the second clock signal and generate a data input driver clock (WCLK) signal and a data latch enable (DLE) signal used for write operations.

8. The integrated circuit of claim 7, wherein the second control signal generator is configured to generate the DLE signal based on the second clock signal and a reset signal for the second clock generator.

9. The integrated circuit of claim 7, wherein the first and second control signal generators are configured to generate the RCLK signal and the WCLK signal with equal delays.

10. The integrated circuit of claim 7, wherein the first and second control signal generators are configured to generate the ALE signal and the DLE signal with equal delays.

11. The integrated circuit of claim 1, further comprising:
a reset circuit configured to generate at least one reset signal for the first and second clock generators.

12. An integrated circuit comprising:
a first clock generator configured to generate a first clock signal used for memory read and memory write operations;
a second clock generator configured to generate a second clock signal used for memory write operations and not used for memory read operations;
a reset circuit configured to generate at least one reset signal for the first and second clock generators; and
a memory array comprising memory cells and dummy cells, and wherein the reset circuit generates the at least one reset signal with timing determined based on loading on a bit line for a column of dummy cells in the memory array.

13. The integrated circuit of claim 12, wherein the reset circuit generates the at least one reset signal with timing determined further based on loading on a word line for a row of dummy cells in the memory array.

14. The integrated circuit of claim 11, wherein the reset circuit comprises a driver having configurable drive strength to obtain different delays for the at least one reset signal for read and write operations.

15. The integrated circuit of claim 11, wherein the reset circuit comprises a delay unit configured to provide programmable delay for the at least one reset signal.

16. An integrated circuit comprising:
a first clock generator configured to generate a first clock signal used for memory read and memory write operations;
a second clock generator configured to generate a second clock signal used for memory write operations and not used for memory read operations;
a reset circuit configured to generate at least one reset signal for the first and second clock generators; and
a power-on reset circuit configured to receive the first and second clock signals and generate a third clock signal for the reset circuit, the power-on reset circuit resetting the first and second clock signals to a known logic level at power on.

17. A method comprising:
generating a first clock signal used for memory read and memory write operations; and
generating a second clock signal used for memory write operations and not used for memory read operations, the first and second clock signals having equal delays,
wherein the generating a second clock signal step is disabled when memory read operations are performed; and
wherein generating the first clock signal comprises generating leading edges on said first clock signal based on an external clock signal and generating trailing edges on said first clock signal based on a reset signal.

18. A method comprising:
generating a first clock signal used for memory read and memory write operations;
generating a second clock signal used for memory write operations and not used for memory read operations, the first and second clock signals having equal delays; and
generating at least one reset signal having timing determined based on a plurality of dummy cells; and
wherein said reset signal is for resetting the first and second clock signals.

19. The method of claim 17, further comprising:
generating a word line control clock (RCLK) signal and an address latch enable (ALE) signal for read and write operations based on the first clock signal.

20. The method of claim 19, further comprising:
generating a data input driver clock (WCLK) signal and a data latch enable (DLE) signal for write operations based on the second clock signal, the RCLK and WCLK signals having equal delays.

21. An apparatus comprising:
means for generating a first clock signal used for memory read and memory write operations; and
means for generating a second clock signal used for memory write operations and not used for memory read operations, the first and second clock signals having equal delays, wherein the means for generating a second clock signal is disabled when memory read operations are performed; and wherein the means for generating the first clock signal comprises a first circuit configured to generate leading edges on the first clock signal based on an external clock signal and to generate trailing edges on the first clock signal based on a reset signal.

22. The apparatus of claim 21, further comprising:
means for generating at least one reset signal having timing determined based on a plurality of dummy cells.

23. The apparatus of claim 21, further comprising:
means for generating a word line control clock (RCLK) signal and an address latch enable (ALE) signal for read and write operations based on the first clock signal.

24. The apparatus of claim 23, further comprising:
means for generating a data input driver clock (WCLK) signal and a data latch enable (DLE) signal for write operations based on the second clock signal, the RCLK and WCLK signals having equal delays.

25. An integrated circuit comprising:
a clock generator configured to generate a first clock signal used for memory read and memory write operations;
a control signal generator configured to receive the first clock signal and generate a second clock signal used for memory write operations, the second clock signal being enabled only for memory write operations; and
a reset circuit configured to generate a reset signal for the clock generator, the reset signal having timing determined based on loading due to a plurality of dummy cells.

26. The integrated circuit of claim 25, wherein the reset circuit is configured to generate the reset signal with different delays for read and write operations.

27. A computer-readable storage medium storing data, which, when executed by an integrated circuit, cause the integrated circuit to perform operational instructions, the instructions comprising:
program code to enable a first clock generator to generate a first clock signal used for memory read and memory write operations; and
program code to enable a second clock generator to generate a second clock signal used for memory write operations and not used for memory read operations; and wherein the first clock generator comprises a first circuit configured to generate leading edges on the first clock signal based on an external clock signal and to generate trailing edges on the first clock signal based on a reset signal.

28. A method, comprising:
generating a first clock signal used for memory read and memory write operations;
generating, based on the first clock signal, a second clock signal used for memory write operations, the second clock signal being enabled only for memory write operations; and
generating a reset signal for a clock generator that generates the first clock signal, the reset signal having timing determined based on loading due to a plurality of dummy cells.

29. An integrated circuit, comprising:
means for generating a first clock signal used for memory read and memory write operations;
means for generating, based on the first clock signal, a second clock signal used for memory write operations, the second clock signal being enabled only for memory write operations; and
means for generating a reset signal for the means for generating the first clock signal, the reset signal having timing determined based on loading due to a plurality of dummy cells.

30. A computer-readable storage medium storing data, which, when executed by an integrated circuit, cause the integrated circuit to perform operational instructions, the instructions comprising:
program code to enable a first clock generator to generate a first clock signal used for memory read and memory write operations;
program code to enable a second clock generator to generate, based on the first clock signal, a second clock signal used for memory write operations, the second clock signal being enabled only for memory write operations; and
program code to enable a reset circuit to generate a reset signal for the program code to enable the first clock generator to generate the first clock signal, the reset signal having timing determined based on loading due to a plurality of dummy cells.

* * * * *